Figure 1:
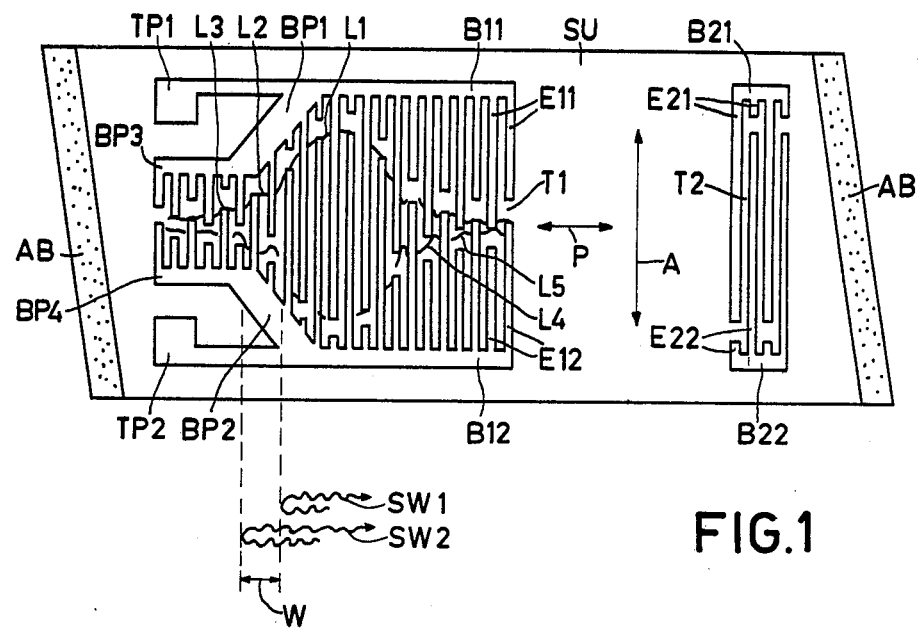

United States Patent [19]

Bower

[11] 4,420,728
[45] Dec. 13, 1983

[54] ACOUSTIC WAVE DEVICES

[75] Inventor: David E. Bower, London, England

[73] Assignee: U.S. Philips Corporation, New York, N.Y.

[21] Appl. No.: 327,142

[22] Filed: Dec. 3, 1981

[30] Foreign Application Priority Data

Dec. 19, 1980 [GB] United Kingdom ................ 8040796

[51] Int. Cl.$^3$ .......................... H03H 9/64; H03H 9/42
[52] U.S. Cl. .................................... 333/151; 333/154; 333/194; 333/196
[58] Field of Search .............................. 333/193–196, 333/150–155; 310/313 R, 313 A, 313 B, 313 C, 313 D

[56] References Cited

U.S. PATENT DOCUMENTS

| | | | |
|---|---|---|---|
| 4,139,791 | 2/1979 | Yamada et al. | 333/150 X |
| 4,144,508 | 3/1979 | Lewis et al. | 333/194 X |
| 4,201,964 | 5/1980 | Noro et al. | 333/196 X |
| 4,205,285 | 5/1980 | Dempsey et al. | 310/313 C X |

Primary Examiner—Marvin L. Nussbaum
Attorney, Agent, or Firm—Robert T. Mayer; Bernard Franzblau

[57] ABSTRACT

A surface acoustic wave filter includes a length-weighted interdigital transducer (T1) on one side of which are bus bar parts (BP1, BP2) which are within the transducer acoustic aperture (A), are inclined at an acute angle to the propagation path (P) and which closely follow the major lobe (L1). These bus bar parts each have a width (W) along the propagation path (P) defined by $2W = n\lambda/2$ where n is an odd integer and $\lambda$ is the wavelength of surface acoustic waves at substantially the maximum amplitude response frequency of the transducer (T1). The components of the surface acoustic waves reflected from the two edges of each inclined bus bar part along the propagation path, that is to say the component reflected waves (SW1) reflected from the edge closest to the overlap envelope and the component reflected waves (SW2) reflected from the edge which forms part of one end of the transducer, are in antiphase at that maximum response frequency and so spurious signals due to the component reflected waves (SW1 and SW2) at that frequency are substantially suppressed.

11 Claims, 3 Drawing Figures

ACOUSTIC WAVE DEVICES

This invention relates to acoustic wave devices including a substrate able to propagate acoustic waves at a surface thereof and a transducer formed on said surface to launch or receive said acoustic waves at said surface along a propagation path through the transducer, in which the transducer includes an interdigital array of two overlapping sets of electrodes and each set is connected to one of two opposite bus bars, in which the length normal to the propagation path of the overlap envelope varies along the propagation path and the limits of the overlap envelope normal to the propagation path define the acoustic aperture of the transducer, and in which each bus bar extends within the acoustic aperture.

Devices of this type in which the extension of each bus bar within the acoustic aperture reduces the non overlapping portion of the electrodes and hence reduces spurious signals resulting from reflections of acoustic waves by these non overlapping portions are well known, for example as surface acoustic wave television receiver intermediate frequency filters.

Surface acoustic wave devices of this type in which these bus bar extensions within the acoustic aperture form broad pads which fill in the acoustic aperture of the transducer with a first edge following the overlap envelope across the aperture and a second edge perpendicular to the propagation path at one end of the transducer are acknowledged as prior art and shown in FIG. 1 of U.K. Pat. Specification No. 1,574,062 and in FIG. 1 of U.K. Pat. application No. 2,000,932A. In each case a proposal is made for reducing the spurious signal resulting from the reflection of surface acoustic waves by the bus bar edges at the end of the transducer. The proposal of U.K. Pat. Specification No. 1,574,062 is to cover these bus bar edges at the end of the transducer with surface acoustic wave absorbant material. However with this proposal it is difficult to provide this cover with sufficient accuracy at low cost. The proposal of U.K. Pat. application No. 2,000,932A is to divide these bus bar edges at the end of the transducer into at least one pair of partial edges with the two partial edges of each pair being of equal length and separated along the propagation path such that the surface acoustic waves reflected from the two partial edges of each pair are in antiphase. However with this proposal the bus bar extensions are still broad pads occupying valuable space on the substrate which could otherwise accommodate terminal pads. A further disadvantage common to both proposals is that there is no reduction of the spurious signal resulting from reflection of surface acoustic waves by the other bus bar edges which follow the overlap envelope.

An object of this invention is to provide an alternative means of reducing the spurious signals resulting from reflections of acoustic waves by the bus bar extensions within the acoustic aperture in devices of the known type without the above-mentioned disadvantages associated with the proposals of U.K. Pat. Specification No. 1,574,062 and of U.K. Pat. Application No. 2,000,932A.

According to the invention there is provided an acoustic wave device as described in the opening paragraph of this specification, characterised in that at least part of each bus bar within the acoustic aperture is inclined to the propagation path and has a width $W$ along the propagation path defined by $2W + n\lambda/2$ where $n$ is an odd integer and $\lambda$ is the wavelength of said acoustic waves at substantially the maximum amplitude response frequency of the transducer. In this case the acoustic waves reflected from the two edges of each inclined bus bar part along the propagation path are substantially in antiphase at the maximum response frequency.

Particularly advantageous optional features according to the invention are as follows. A bus bar part of said width $W$ within the acoustic aperture may be inclined at an acute angle to the propagation path, rather than at right angles to that path, in which case residual spurious signals due to incompletely suppressed reflected acoustic waves from these bus bar parts are reduced. Reliable fabrication of the transducer is enhanced if an inclined bus bar part within the acoustic aperture has a minimum width $W$ determined by the odd integer $n$ being not less than three. The overlap envelope conventionally frequently consists of a central major lobe and minor lobes on either side of the major lobe along the propagation path. In this case it could be difficult to provide bus bar parts in the region of the minor lobes which so closely follow the overlap envelope to reduce the non overlapping portions of the electrodes in this region that they include bus bar parts inclined to the propagation path. A favourable compromise in this case is a transducer wherein to one side of the centre of the transducer there are provided bus bar parts which are within the acoustic aperture, which are inclined to the propagation path, which are of said width $W$ and which closely follow the major lobe, and wherein to the same side of the centre of the transducer there are provided bus bar parts which are within the acoustic aperture, which are not inclined to the propagation path and which closely follow some of the minor lobes.

In devices according to the invention the acoustic waves which the substrate is able to propagate at a surface thereof may be conventional surface acoustic waves propagating in the surface of the substrate, which may be lithium niobate. The acoustic waves may otherwise be, for example, bulk acoustic waves propagating parallel and close to that surface of the substrate. The possible use of this type of bulk acoustic wave is mentioned in connection with delay line feedback oscillators in U.K. Pat. Specification No. 1,451,326 and a range of rotated Y-cuts of quartz with propagation perpendicular to the X-axis suitable for this purpose is described in Electronics Letters, 3rd Mar. 1977, Vol. 13, No. 5 at pages 128 to 130. The acoustic waves may also otherwise be, for example, piezoelectric leaky surface waves propagating along the X-axis of a 41° or 64° rotated Y-cut plane of lithium niobate as described in an article by K. Yamanouchi and K. Shibayama in Journal of Applied Physics, Vol. 43, No. 3, March 1972 at pages 856 to 862.

Figure 2:
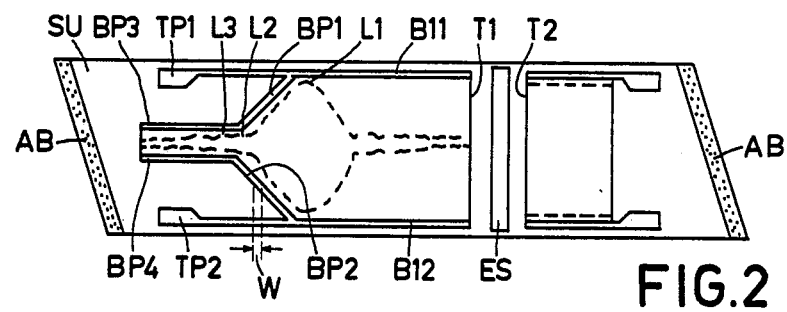
Figure 3:
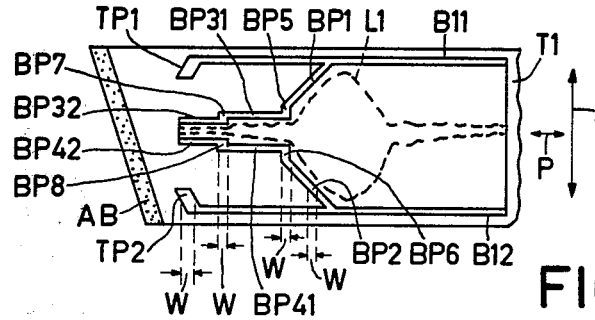

The invention will now be described in more detail with reference to the accompanying drawings, in which:

FIG. 1 shows schematically in plan view a surface acoustic wave filter according to the invention, FIG. 2 shows schematically in plan view the filter of FIG. 1 modified in that the transducer electrodes are now shown, a ground strip between the two transducers is shown, and in that the outline shapes of the substrate, transducers and ground strip are approximately those suitable for a television receiver intermediate frequency filter, and FIG. 3 shows part of the filter of FIG. 2 modified to illustrate variations of the bus bar configuration of one of the transducers.

Referring now to FIG. 1 there is shown schematically in plan view a surface acoustic wave filter consisting of a substrate SU, preferably lithium niobate, able to propagate surface acoustic waves at a surface thereof and two transducers T1, T2 formed on the surface, one transducer to launch and one transducer to receive surface acoustic waves at the surface along a propagation path P through the transducers T1, T2. The ends of the substrate SU are covered with surface acoustic wave absorbant material AB and are angled to deflect any residual reflected surface acoustic waves away from the propagation path P. Each transducer T1, T2 includes an interdigital array of two overlapping sets of electrodes, each set being connected to one of two opposite bus bars. In the transducer T1 two overlapping sets of electrodes E11, E12 are respectively connected to bus bars B11, B12, and in the transducer T2 two overlapping sets of electrodes E21, E22 are respectively connected to bus bars B21, B22. Extensions of the bus bars B11, B12 lead respectively to terminal pads TP1, TP2 for the transducer T1.

In the transducer T1 the length normal to the propagation path P of the electrode overlap envelope varies along the path P and the limits of the overlap envelope normal to the path P define the acoustic aperture A of the transducer T1. This overlap envelope consists of a central major lobe L1, minor lobes L2, L3 etc on one side of the major lobe along the path P and minor lobes L4, L5 etc on the other side of the major lobe L1 along the path P.

To one side of the centre of the transducer T1, that is to say on the side of the centre of the lobe L1 away from the other transducer T2 and near one end of the substrate SU, the bus bars B11, B12 each extend within the acoustic aperture A. To this side of the transducer T1 there are provided bus bar parts BP1, BP2 which are within the acoustic aperture A, which are inclined at an acute angle to the propagation path P and which closely follow the major lobe L1. To this same side of the transducer T1 there are provided bus bar parts BP3, BP4 which are within the acoustic aperture A, which are not inclined to the propagation path P and which closely follow some of the minor lobes L2, L3, L4, L5 etc.

The bus bar parts BP1 and BP2 each have a width W along the propagation path P defined by $2W = n\lambda/2$ where n is an odd integer and $\lambda$ is the wavelength of surface acoustic waves at substantially the maximum amplitude response frequency of the transducer T1. In this case the components of the surface acoustic waves reflected from the two edges of each inclined bus bar part BP1 and BP2 along the propagation path P, that is to say the component reflected waves SW1 reflected from the edge closest to the overlap envelope and the component reflected waves SW2 reflected from the edge which forms part of one end of the transducer, are in antiphase at that maximum response frequency and so spurious signals due to the component reflected waves SW1 and SW2 at that frequency are substantially suppressed. The inclination of the bus bar parts BP1 and BP2 at an acute angle to the path P, rather than at right angles to that path, reduces residual spurious signals due to incompletely suppressed reflected surface acoustic waves from those bus bar parts. Reliable fabrication of the transducer T1 is enhanced if the inclined bus bar parts BP1 and BP2 have a minimum width W determined by the odd integer n being not less than three.

Referring now to FIG. 2, similar parts to those shown in FIG. 1 have the same reference numerals as in FIG. 1. There is shown schematically in plan view the filter of FIG. 1 modified in that the transducer electrodes are not shown, a ground strip ES between the transducers is shown, and in that the outline shapes of the substrate, transducers and ground strip are approximately those suitable for a television receiver intermediate frequency filter. A substrate suitable for use with the in-line arrangement of the two transducers without a multistrip coupler is, for example, $+\theta°$ rotated Y-cut X-propagating lithium niobate with $\theta$ in the range of 123° to 125°.

Referring now to FIG. 3, there is shown part of the filter of FIG. 2 modified to illustrate possible variations of the bus bar configuration of the transducer T1. Bus bar parts BP1 and BP2 are provided which are within the acoustic aperture A, which are inclined at an acute angle to the propagation path P, which closely follow the major lobe L1 and which have a width W according to the above-mentioned definition. Bus bar parts BP31, BP32, BP41 and BP42 are provided which are within the acoustic aperture A, but which are not inclined to the propagation path P and which closely follow some of the minor lobes of the transducer T1. Bus bar parts BP5, BP6, BP7 and BP8 are provided which are within the acoustic aperture A, which are inclined at right angles to the propagation path P and which have a width W according to the above-mentioned definition. The inclusion of the bus bar parts BP5, BP6 which closely follow the major lobe L1 and the bus bar parts BP7, BP8 which closely follow a minor lobe enables the extensions of the bus bars B11 and B12 within the acoustic aperture A to more closely follow the electrode overlap envelope than is the case with the bus bar configuration of FIG. 2. The terminal pads TP1, TP2 are shown to have a parallelogram shape such that where they extend within the acoustic aperture A they also have a width W according to the above-mentioned definition for surface acoustic wave reflection suppression.

I claim:

1. An acoustic wave device comprising a substrate able to propagate acoustic waves at a surface thereof, a transducer formed on said surface to launch or receive said acoustic waves at said surface along a propagation path through the transducer, the transducer including an interdigital array of two overlapping sets of electrodes with each set connected to one of two opposite bus bars, in which the length of the overlap envelope normal to the propagation path varies along the propagation path and the limits of the overlap envelope normal to the propagation path define the acoustic aperture of the transducer, and wherein each bus bar extends within the acoustic aperture, at least a part of each bus bar within the acoustic aperture being inclined to the propagation path and having a width W along the propagation path defined by $2W = n\lambda/2$ where n is an odd integer and $\lambda$ is the wavelength of said acoustic waves at substantially the maximum amplitude response frequency of the transducer.

2. An acoustic wave device as claimed in claim 1, wherein at least a part of each bus bar within the acoustic aperture is inclined at an acute angle to the propagation path and is of said width W.

3. An acoustic wave device as claimed in claim 1 or claim 2, wherein the odd integer n is not less than three.

4. An acoustic wave device as claimed in claims 1 or 2 wherein the overlap envelope includes a central major lobe and minor lobes on either side of the major lobe along the propagation path, wherein to one side of the centre of the transducer there are provided bus bar parts which are within the acoustic aperture, which are inclined to the propagation path, which are of said width W and which closely follow the major lobe, and wherein to the same side of the centre of the transducer there are provided bus bar parts which are within the acoustic aperture, which are not inclined to the propagation path and which closely follow some of the minor lobes.

5. An acoustic wave device as claimed in claims 1 or 2, wherein said acoustic waves are surface acoustic waves.

6. An acoustic wave device as claimed in claim 5, wherein said substrate is lithium niobate.

7. An acoustic wave device as claimed in claim 3 wherein the overlap envelope includes a central major lobe and minor lobes on either side of the major lobe along the propagation path, wherein to one side of the center of the transducer there are provided bus bar parts which are within the acoustic aperture, which are inclined to the propagation path, which are of said width W and which closely follow the major lobe, and wherein to the same side of the center of the transducer there are provided bus bar parts which are within the acoustic aperture, which are not inclined to the propagation path and which closely follow some of the minor lobes.

8. An acoustic wave device as claimed in claim 3 wherein said acoustic waves are surface acoustic waves.

9. An acoustic wave device as claimed in claim 4 wherein said acoustic waves are surface acoustic waves.

10. An acoustic wave device as claimed in claim 3 wherein said substrate is lithium niobate.

11. An acoustic wave device as claimed in claim 4 wherein said substrate is lithium niobate.

* * * * *